(12) United States Patent
Li

(10) Patent No.: US 12,531,357 B2
(45) Date of Patent: Jan. 20, 2026

(54) CIRCUIT BOARD ASSEMBLY WITH INTERCONNECTING FIXING BRACKETS HOLDING BOARD-TO-BOARD CONNECTORS TO A CIRCUIT BOARD AND A DEVICE USING THE SAME

(71) Applicant: VIVO MOBILE COMMUNICATION CO., LTD., Guangdong (CN)

(72) Inventor: Pei Li, Guangdong (CN)

(73) Assignee: VIVO MOBILE COMMUNICATION CO., LTD., Guangdong (CN)

(*) Notice: Subject to any disclaimer, the term of this patent is extended or adjusted under 35 U.S.C. 154(b) by 492 days.

(21) Appl. No.: 18/104,732

(22) Filed: Feb. 1, 2023

(65) Prior Publication Data

US 2023/0178909 A1 Jun. 8, 2023

Related U.S. Application Data

(63) Continuation of application No. PCT/CN2021/110018, filed on Aug. 2, 2021.

(30) Foreign Application Priority Data

Aug. 3, 2020 (CN) .......................... 202010767024.5

(51) Int. Cl.
*H01R 12/52* (2011.01)
*H01R 12/70* (2011.01)
(Continued)

(52) U.S. Cl.
CPC ........... *H01R 12/52* (2013.01); *H01R 12/707* (2013.01); *H01R 12/716* (2013.01); *H05K 7/12* (2013.01);
(Continued)

(58) Field of Classification Search
CPC .... H01R 12/52; H01R 12/707; H01R 12/716; H01R 12/51; H01R 12/526;
(Continued)

(56) References Cited

U.S. PATENT DOCUMENTS

| 2006/0057887 A1 | 3/2006 | Lin |
| 2013/0128482 A1 | 5/2013 | Qin et al. |

(Continued)

FOREIGN PATENT DOCUMENTS

| CN | 103124484 A | 5/2013 |
| CN | 206353647 A | 7/2017 |

(Continued)

OTHER PUBLICATIONS

First Office Action for Chinese Application No. 202010767024.5, dated Apr. 23, 2021, 5 Pages.

(Continued)

*Primary Examiner* — Justin M Kratt
(74) *Attorney, Agent, or Firm* — BROOKS KUSHMAN P.C.

(57) ABSTRACT

A circuit board assembly and an electronic device. The circuit board assembly includes: a circuit board to which a first board-to-board connector and a second board-to-board connector are mounted; a first bracket, where the first bracket is mounted on the circuit board, the first bracket is located on a side of the first board-to-board connector away from the circuit board; a second bracket, where the second bracket is mounted on the circuit board, and the second bracket is located on a side of the second board-to-board connector away from the circuit board, and the second bracket is disposed neighboring to the first bracket and the second bracket is provided with a tongue insert; and a fixing member, where the fixing member is connected to the circuit board and the fixing member is provided with a slot.

18 Claims, 4 Drawing Sheets

(51) Int. Cl.
  *H01R 12/71* (2011.01)
  *H05K 7/12* (2006.01)
  *H01R 12/51* (2011.01)
  *H01R 12/73* (2011.01)
  *H01R 12/79* (2011.01)
  *H01R 13/62* (2006.01)
  *H01R 13/629* (2006.01)
  *H01R 13/639* (2006.01)

(52) U.S. Cl.
  CPC ............ *H01R 12/51* (2013.01); *H01R 12/526* (2013.01); *H01R 12/7011* (2013.01); *H01R 12/71* (2013.01); *H01R 12/712* (2013.01); *H01R 12/714* (2013.01); *H01R 12/73* (2013.01); *H01R 12/79* (2013.01); *H01R 13/62* (2013.01); *H01R 13/62983* (2013.01); *H01R 13/639* (2013.01)

(58) Field of Classification Search
  CPC .. H01R 12/7011; H01R 12/71; H01R 12/712; H01R 12/714; H01R 12/73; H01R 12/79; H01R 13/62; H01R 13/62983; H01R 13/639; H05K 7/12
  See application file for complete search history.

(56) References Cited

U.S. PATENT DOCUMENTS

2015/0140858 A1* 5/2015 Yoshiura ............ H01R 13/502
  439/567
2020/0185860 A1 6/2020 Zeng et al.

FOREIGN PATENT DOCUMENTS

| CN | 107086384 | A |   | 8/2017  |            |
|----|-----------|---|---|---------|------------|
| CN | 108307585 | A |   | 7/2018  |            |
| CN | 108321568 | A | * | 7/2018  | H01R 12/7064 |
| CN | 210007023 | A |   | 1/2020  |            |
| CN | 111834814 | A |   | 10/2020 |            |
| JP | 2015103289| A |   | 6/2015  |            |
| WO | 2018205906| A1|   | 11/2018 |            |

OTHER PUBLICATIONS

International Search Report and Written Opinion for Application No. PCT/CN2021/110018, dated Nov. 11, 2021, 8 Pages.
Extended European Search Report for Application No. 21853798.3, dated Dec. 19, 2023, 10 Pages.
First Office Action for Japanese Application No. 2023-507505, dated Jan. 25, 2024, 3 Pages.

* cited by examiner

CIRCUIT BOARD ASSEMBLY WITH INTERCONNECTING FIXING BRACKETS HOLDING BOARD-TO-BOARD CONNECTORS TO A CIRCUIT BOARD AND A DEVICE USING THE SAME

CROSS-REFERENCE TO RELATED APPLICATIONS

This application is a continuation of International Application No. PCT/CN2021/110018 filed on Aug. 2, 2021, which claims priority to Chinese Patent Application No. 202010767024.5, filed on Aug. 3, 2020, which are incorporated herein by reference in their entireties.

TECHNICAL FIELD

This application relates to the field of electronic device technologies, and in particular, to a circuit board assembly and an electronic device.

BACKGROUND

At present, electronic devices have been developing toward being light and thin and integrating more and more functions inside. As a result, a space for mounting functional devices that implement various functions becomes increasingly small. For example, a circuit board of a camera module in a mobile phone is connected to a mainboard of the electronic device by typically using a board-to-board connector, while the board-to-board connector needs to be fastened to the mainboard with screws.

However, with an increasing number of board-to-board connectors in electronic devices, the way of fastening with screws leads to many screw holes in the circuit board, while arrangement of the screw holes affects the trace layout. Guarantee of trace layout for important chips on the mainboard results in insecure connection between the board-to-board connectors and the circuit board.

SUMMARY

Embodiments of this application provides a circuit board assembly and an electronic device.

To resolve the foregoing technical problem, this application is implemented as follows:

According to a first aspect, an embodiment of this application provides a circuit board assembly, including:
  a circuit board to which a first board-to-board connector and a second board-to-board connector are mounted;
  a first bracket, where the first bracket is mounted on the circuit board, the first bracket is located on a side of the first board-to-board connector away from the circuit board, the first bracket is configured to fasten the first board-to-board connector, and the first bracket is provided with an escape hole;
  a second bracket, where the second bracket is mounted on the circuit board, the second bracket is located on a side of the second board-to-board connector away from the circuit board, the second bracket is configured to fasten the second board-to-board connector, the second bracket is disposed neighboring to the first bracket, and the second bracket is provided with a tongue insert, the tongue insert being located on a side of the second bracket facing toward the first bracket; and
  a fixing member, where the fixing member is connected to the circuit board and the fixing member is provided with a slot, the slot extending out from the escape hole and at least part of the tongue insert being inserted into the slot.

According to a second aspect, an embodiment of this application further provides an electronic device, including the foregoing circuit board assembly, where the circuit board is a mainboard of the electronic device.

In embodiments of this application, for a neighboring area of the first bracket and the second bracket, the fixing member is used to fasten the first bracket and the second bracket to the circuit board, which can improve firmness of the connection of the neighboring area of the first bracket and the second bracket to the circuit board. In addition, as fewer screw connection structures are used, the fewer screw mounting holes can be provided in the circuit board, improving utilization of the circuit board.

DETAILED DESCRIPTION

The following clearly describes the technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application without creative efforts shall fall within the protection scope of this application.

In the specification and the claims of this application, the terms "first", "second", and so on are intended to distinguish between different objects but do not describe a specific order or sequence. It should be understood that data used in this way is used interchangeably in appropriate circumstances so that the embodiments of this application can be implemented in other orders than the order illustrated or described herein. In addition, in this specification and claims, "and/or" represents at least one of the objects connected, and the symbol "/" generally represents an "or" relationship between the associated objects.

Figure 1:
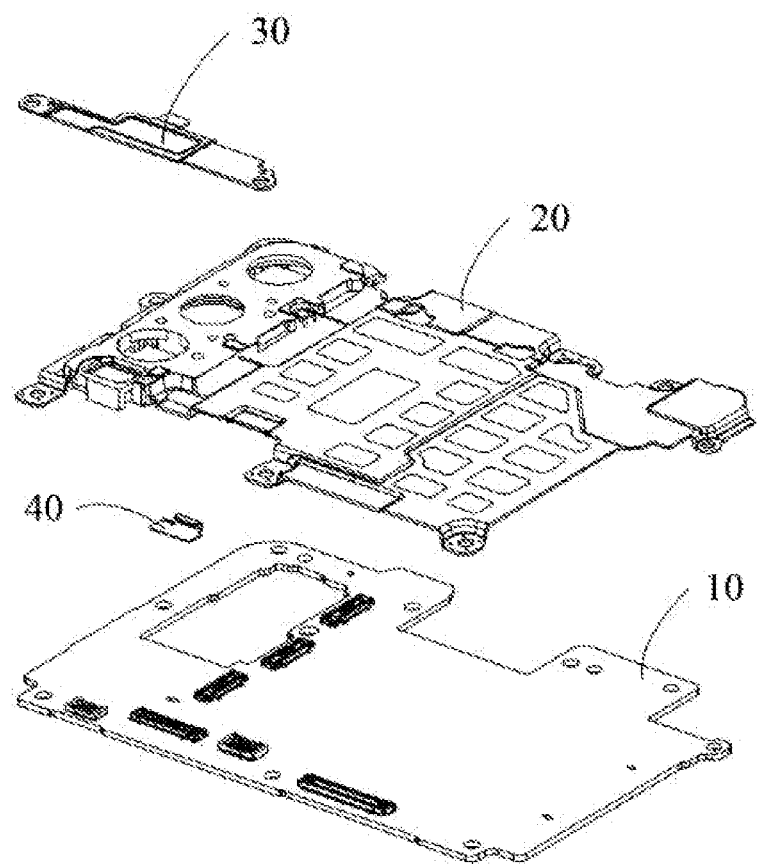
FIG. 1 is an exploded view of a circuit board assembly according to an embodiment of this application.
Figure 2:
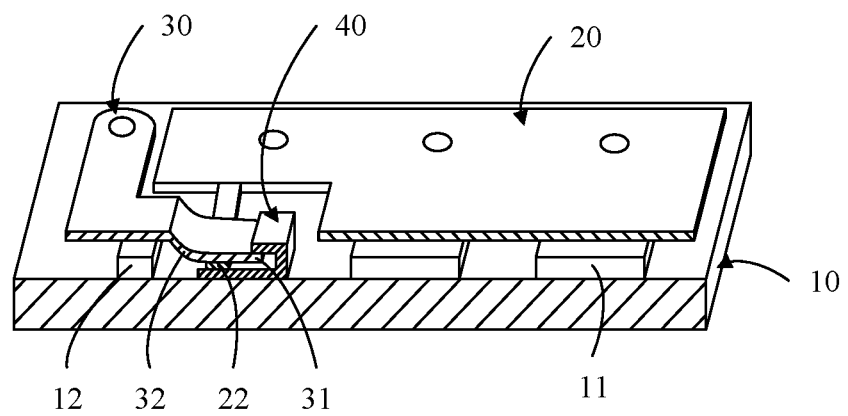
FIG. 2 is a cross-sectional diagram of a circuit board assembly according to an embodiment of this application.

As shown in FIG. 1 and FIG. 2, an embodiment of this application provides a circuit board assembly, including:
  a circuit board 10 to which a first board-to-board connector 11 and a second board-to-board connector 12 are mounted;
  a first bracket 20, where the first bracket 20 is mounted on the circuit board 10, the first bracket 20 is located on a side of the first board-to-board connector 11 away from the circuit board 10, the first bracket 20 is configured to fasten the first board-to-board connector 11, and the first bracket 20 is provided with an escape hole 21;

a second bracket 30, where the second bracket 30 is mounted on the circuit board 10, the second bracket 30 is located on a side of the second board-to-board connector 12 away from the circuit board 10, the second bracket 30 is configured to fasten the second board-to-board connector 12, the second bracket 30 is disposed neighboring to the first bracket 20, and the second bracket 30 is provided with a tongue insert 31, the tongue insert 31 being located on a side of the second bracket 30 facing toward the first bracket 20; and a fixing member 40, where the fixing member 40 is connected to the circuit board 10 and the fixing member 40 is provided with a slot 41, the slot 41 extending out from the escape hole 21 and at least part of the tongue insert 31 being inserted into the slot 41.

In this implementation, for the board-to-board connectors mounted on the circuit board 10, as each of the board-to-board connectors corresponds to a different functional component, the board-to-board connectors are mounted onto the circuit board 10 in chronological order. Therefore, a board-to-board connector that needs to be installed earlier may be set as the first board-to-board connector 11, and a board-to-board connector that needs to be installed later may be set as the second board-to-board connector 12, and then the first bracket 20 and the second bracket 30 are used to fasten the first board-to-board connector 11 and the second board-to-board connector 12 respectively.

The first bracket 20 and the second bracket 30 may be fastened on the circuit board 10 with screws, so as to fasten the first board-to-board connector 11 and the second board-to-board connector 12, ensuring stability of connection of the first board-to-board connector 11 and the second board-to-board connector 12 to the circuit board 10.

In addition, for a neighboring area of the first bracket 20 and the second bracket 30, the fixing member 40 is used to fasten the first bracket 20 and the second bracket 30 to the circuit board 10, which can improve firmness of the connection of the neighboring area of the first bracket 20 and the second bracket 30 to the circuit board 10. In addition, as fewer screw connection structures are used, fewer screw mounting holes can be provided in the circuit board 10, improving utilization of the circuit board 10.

The fixing member 40 is provided with the slot 41, and the escape hole 21 is provided on a side of the first bracket 20 neighboring to the second bracket 30, so that the slot 41 can extend out from the escape hole 21. The tongue insert 31 may be disposed on a side of the second bracket 30 neighboring to the first bracket 20 and at least part of the tongue insert 31 can be inserted into the slot 41, and through cooperation of the slot 41 and the tongue insert 31, the escape hole 40 is snap-fitted with the second bracket 30. As the tongue insert extends out from the escape hole 21, the first bracket 20 can be fastened as well. Thus, the fixing member 40 fastens the first bracket 20 and the second bracket 30 on the circuit board.

It can be seen that the circuit board assembly according to the embodiment of this application can not only provide firm and reliable connection between board-to-board connectors and the circuit board, but also have a simple and compact structure, occupying a small space.

Figure 3:
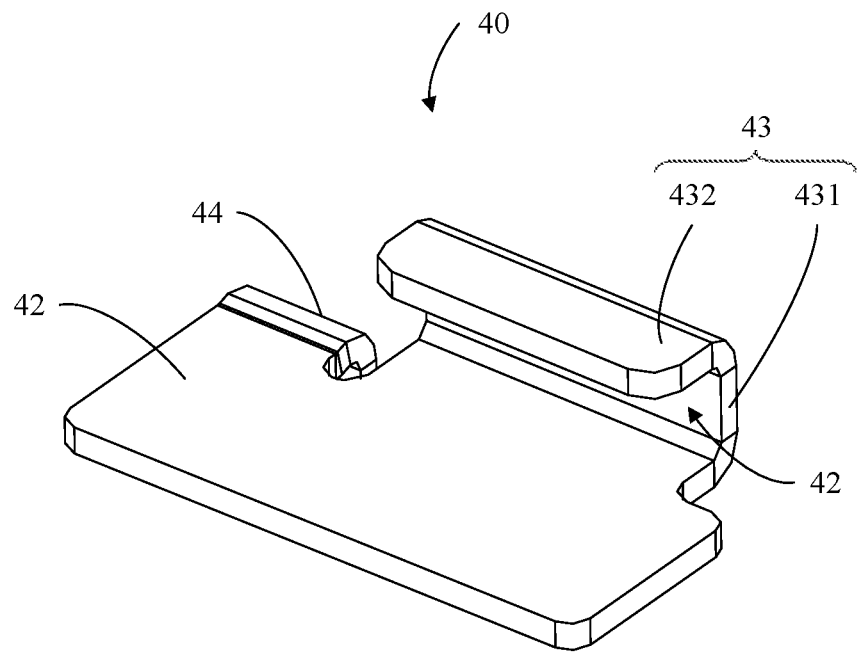
FIG. 3 is a three-dimensional diagram of a fixing member according to an embodiment of this application.

Optionally, as shown in FIG. 3, the fixing member 40 includes a base plate 42 and a clip hook 43, where the base plate 42 is connected to the circuit board 10, the clip hook 43 is disposed on a side of the base plate 42 away from the circuit board 10, and the slot 41 is formed between the clip hook 43 and the base plate 42.

In this implementation, the slot 41 is formed through the provision of the clip hook 43, such that the tongue insert 31 can be inserted into the slot 41 and snap-fitted with the clip hook 43, enabling the fixing member 40 to fasten the first bracket 20 and the second bracket 30.

The clip hook 43 includes a connecting plate 431 and a fixing plate 432, where the connecting plate 431 is connected to the base plate 42, the connecting plate 431 extends away from the circuit board 10, the fixing plate 432 is connected to an end of the connecting plate 431 away from the circuit board 10, and the fixing plate 432 extends toward the tongue insert 31, so as to form the slot 41 between the base plate 42, the connecting plate 431, and the fixing plate 432.

In this way, the tongue insert 31 is inserted into the slot 41 so as to be snap-fitted with the fixing plate 432, enabling the fixing member 40 to fasten the first bracket 20 and the second bracket 30. In addition, to make it easy to insert the tongue insert 31 into the slot 41, a guiding face may be provided at an inserting end of the tongue insert 31, or a guiding face may be provided on a side of the fixing plate 432 facing toward the base plate 42.

Further, the fixing plate 432 may extend away from the circuit board 10, so that an opening size of the slot 41 is gradually reduced in a direction approaching the connecting plate 431, making it easy to insert the tongue insert 31 into the slot 41. In addition, because the opening size of the slot 41 is gradually reduced in the direction approaching the connecting plate 431, the connection between the tongue insert 31 and the slot 41 is more reliable and more secure when the tongue insert 31 is completely inserted into the slot 41.

Figure 4:
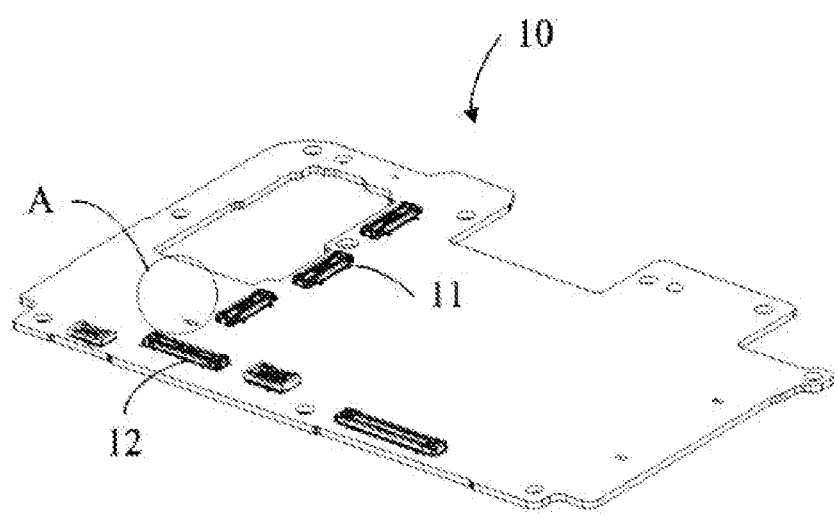
FIG. 4 is a schematic structural diagram of a circuit board assembly according to an embodiment of this application.
Figure 5:
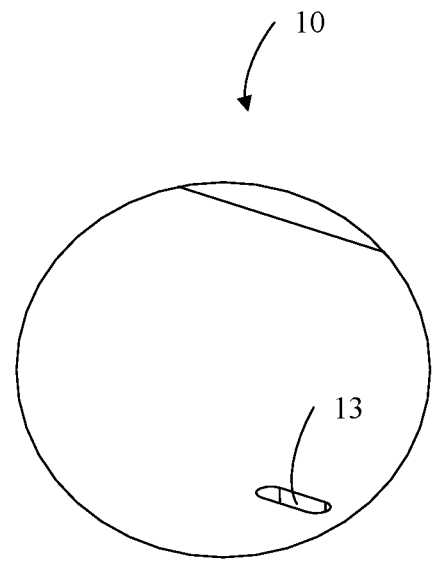
FIG. 5 is a local enlarged view of area A in FIG. 4.

As shown in FIG. 4 and FIG. 5, the circuit board 10 is provided with a mounting hole 13, a connecting pin 44 is provided on a side of the base plate 42 facing toward the circuit board 10, and the connecting pin 44 is mounted inside the mounting hole 13, so as to fasten the fixing member 40 on the circuit board 10.

The connecting pin 44 may be connected to the circuit board 10 by welding. Specifically, the connecting pin 44 may extend into the mounting hole 13 and be soldered with solder paste to ensure a strong tensile strength between the fixing member 40 and the circuit board 10, increasing structural reliability of the circuit board assembly.

Optionally, the mounting hole 13 may be a strip-shaped hole and a length direction of the mounting hole 13 extends along a trace outgoing direction of a processor (not shown in the figure) on the circuit board 10, so that a wiring space occupied by the mounting hole 13 in the circuit board 10 is reduced, further improving utilization of the circuit board 10.

The mounting hole 13 is 0.4 mm-0.6 mm in width and 1.2 mm-1.8 mm in length, which can effectively reduce the space occupied by the mounting hole 13 on the circuit board 10 as compared with a screw hole with a diameter of 1.6 mm in the circuit board 10.

In a specific implementation of this application, the mounting hole 13 may be designed as a rectangular hole 1.5 mm long and 0.5 mm wide, so as to reduce the space occupied by the mounting hole 13 in the circuit board 10.

Figure 6:
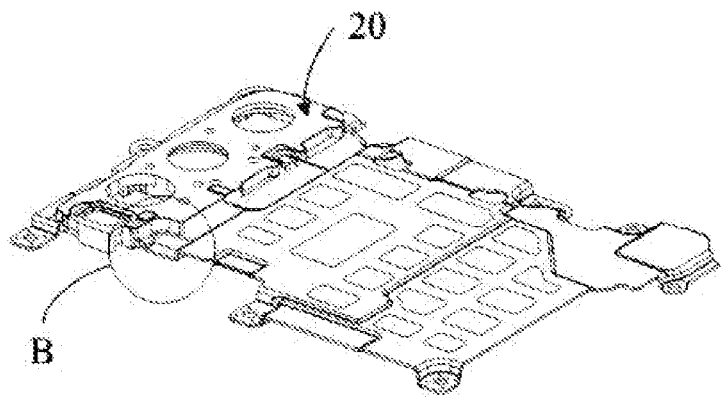
FIG. 6 is a schematic structural diagram of a first bracket according to an embodiment of this application.
Figure 7:
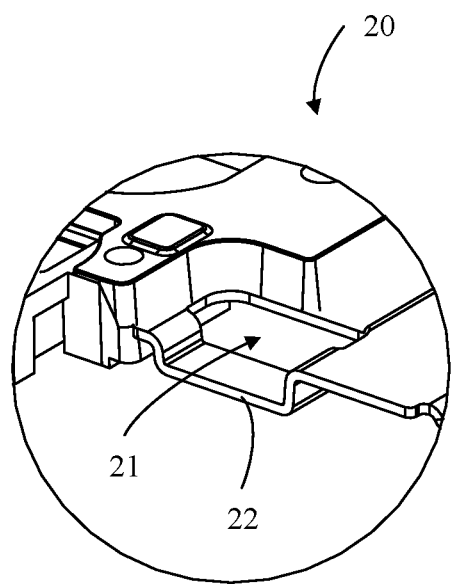
FIG. 7 is a local enlarged view of area B in FIG. 6.

Optionally, as shown in FIG. 6 and FIG. 7, the first bracket 20 is provided with a sunken portion 22, where the sunken portion 22 faces toward the circuit board 10, the sunken portion 22 is located between the escape hole 21 and a body structure of the second bracket 30, and the sunken portion 22 abuts against a side of the tongue insert 31 facing toward the circuit board 10.

In this implementation, the first bracket 20 is provided with the sunken portion 22 such that the escape hole 21 for extending of the slot 41 is formed in the first bracket 20, and the sunken portion 22 is located between the tongue insert 31 and the base plate 42. In this way, the fixing member 40 can also function to fasten the first bracket 20, achieving the purpose of using the fixing member 40 to fasten the first bracket 20 and the second bracket 30.

In addition, the provision of the sunken portion 22 allows the forming of the escape hole 21 for extending of the slot 41, reducing the size of the fixing member 40 in a thickness direction of the circuit board, thereby achieving the purpose of easy spatial layout and weight reduction.

In this way, in a position in which the fixing member 40 is located, the sunken portion 22 and tongue insert 31 are stacked on the base plate 42 in sequence and the tongue insert 31 is snap-fitted with the slot 41, so as to fasten the first bracket 20 and the second bracket 30 using the fixing member 40, which also improves reliability of the connection of the neighboring area of the first bracket 20 and the second bracket 30 to the circuit board 10.

Figure 8:
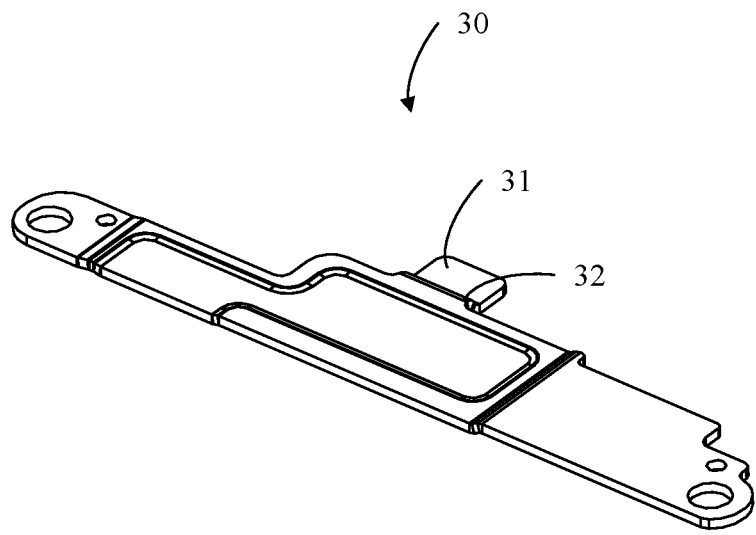
FIG. 8 is a schematic structural diagram of a second bracket according to an embodiment of this application.

Optionally, as shown in FIG. 8, the second bracket 30 is provided with a transition portion 32 connecting to the tongue insert 31, where the transition portion 32 extends, in a direction facing toward the tongue insert 31, toward the circuit board 10

In this implementation, the transition portion 32 extending, in the direction facing the tongue insert 31, toward the circuit board 10 can reduce the size of the fixing member 40 in the thickness direction of the circuit board, so as to achieve the purpose of easy space layout and weight reduction.

As shown in FIG. 4, the first board-to-board connector 11 may be provided in plurality, and the plurality of first board-to-board connectors 11 may be arranged along a first direction; and the second board-to-board connector 12 may also be provided in plurality and the plurality of second board-to-board connectors 12 may be arranged along a second direction, where an included angle between the first direction and the second direction is greater than 0°, and one first board-to-board connector 11 and one second board-to-board connector 12 are located respectively on two opposite sides of the fixing member 40.

Thus, with one first board-to-board connector 11 and one second board-to-board connector 12 disposed on each of the two opposite sides of the fixing member 40, the mixing member 40 fastens the two board-to-board connectors, improving fastening efficiency of the fixing member 40. In addition, this also reduces use of screw connection structures and therefore reduces screw mounting holes provided in the circuit board 10, improving utilization of the circuit board 10.

Optionally, the included angle between the first direction and the second direction may be 90°, such that the first board-to-board connector 11 and the second board-to-board connector 12 can be better arranged on the circuit board 10.

The second board-to-board connector 12 includes a fingerprint module board-to-board connector, so that the finger module board-to-board connector can be better mounted on the circuit board 10.

Both the first bracket 20 and the second bracket 30 are provided with a screw hole, and the circuit board 10 is also provided with through-holes fitting the screw holes, such that the first bracket 20 and the second bracket 30 can be mounted on the circuit board 10 with screws. In addition, in the neighboring area of the first bracket 20 and the second bracket 30, the fixing member 40 is used to fasten the first bracket 20 and the second bracket 30 to the circuit board 10.

An embodiment of this application further provides an electronic device, including the foregoing circuit board assembly, where the circuit board is a mainboard of the electronic device. It should be note that the implementations of the embodiment of the circuit board assembly are also applicable to the embodiment of the electronic device, with the same technical effects achieved. Details are not described herein again.

It should be noted that, in this specification, the terms "include", "comprise", or any of their variants are intended to cover a non-exclusive inclusion, such that a process, method, article, or apparatus that includes a series of elements not only includes those elements but also includes other elements that are not expressly listed, or further includes elements inherent to such process, method, article, or apparatus. In the absence of more restrictions, an element defined by "including a . . . " does not exclude the presence of another same element in a process, method, article, or apparatus that includes that element.

Embodiments of this application have been described above with reference to the accompanying drawings. However, this application is not limited to these specific embodiments. The foregoing specific embodiments are merely illustrative rather than restrictive. As inspired by this application, a person of ordinary skill in the art may develop many other forms that are not departing from the principle of this application and the protection scope of the claims, and all such forms fall within the protection scope of this application.

What is claimed is:

1. A circuit board assembly, comprising:
   a circuit board to which a first board-to-board connector and a second board-to-board connector are mounted;
   a first bracket, wherein the first bracket is mounted on the circuit board, the first bracket is located on a side of the first board-to-board connector away from the circuit board, the first bracket is configured to fasten the first board-to-board connector, and the first bracket is provided with an escape hole;
   a second bracket, wherein the second bracket is mounted on the circuit board, the second bracket is located on a side of the second board-to-board connector away from the circuit board, the second bracket is configured to fasten the second board-to-board connector, the second bracket is disposed neighboring to the first bracket, and the second bracket is provided with a tongue insert, the tongue insert being located on a side of the second bracket facing toward the first bracket; and
   a fixing member, wherein the fixing member is connected to the circuit board and the fixing member is provided with a slot, the slot extending out from the escape hole and at least part of the tongue insert being inserted into the slot;
   wherein the first bracket is provided with a sunken portion, the sunken portion facing toward the circuit board, the sunken portion being located between the escape hole and the second bracket, and the sunken portion abutting against a side of the tongue insert facing toward the circuit board.

2. The circuit board assembly according to claim 1, wherein the fixing member comprises a base plate and a clip hook, the base plate being connected to the circuit board, the clip hook being disposed on a side of the base plate away from the circuit board, and the slot being formed between the clip hook and the base plate.

3. The circuit board assembly according to claim 2, wherein the circuit board is provided with a mounting hole, a connecting pin is provided on a side of the base plate facing toward the circuit board, and the connecting pin is mounted inside the mounting hole, so as to mount the fixing member on the circuit board.

4. The circuit board assembly according to claim 3, wherein the connecting pin is joined to the circuit board by welding.

5. The circuit board assembly according to claim 3, wherein the mounting hole is a strip-shaped hole and a length direction of the mounting hole extends along a trace outgoing direction of a processor on the circuit board.

6. The circuit board assembly according to claim 2, wherein the clip hook comprises a connecting plate and a fixing plate, the connecting plate being connected to the base plate, the connecting plate extending away from the circuit board, the fixing plate being connected to an end of the connecting plate away from the circuit board, and the fixing plate extending toward the tongue insert, so as to form the slot between the base plate, the connecting plate, and the fixing plate.

7. The circuit board assembly according to claim 6, wherein the fixing plate extends away from the circuit board, so that an opening size of the slot is gradually reduced in a direction approaching the connecting plate.

8. The circuit board assembly according to claim 1, wherein the second bracket is provided with a transition portion connecting to the tongue insert, the transition portion extending, in a direction facing the tongue insert, toward the circuit board.

9. The circuit board assembly according to claim 1, wherein the first board-to-board connector is provided in plurality, and the plurality of first board-to-board connectors are arranged along a first direction; the second board-to-board connector is provided in plurality, and the plurality of second board-to-board connectors are arranged along a second direction; and an included angle between the first direction and the second direction is greater than 0°, wherein one of the first board-to-board connectors and one of the second board-to-board connectors are respectively located on two opposite sides of the fixing portion.

10. An electronic device, comprising a circuit board assembly, wherein the circuit board assembly comprises:
a circuit board to which a first board-to-board connector and a second board-to-board connector are mounted;
a first bracket, wherein the first bracket is mounted on the circuit board, the first bracket is located on a side of the first board-to-board connector away from the circuit board, the first bracket is configured to fasten the first board-to-board connector, and the first bracket is provided with an escape hole;
a second bracket, wherein the second bracket is mounted on the circuit board, the second bracket is located on a side of the second board-to-board connector away from the circuit board, the second bracket is configured to fasten the second board-to-board connector, the second bracket is disposed neighboring to the first bracket, and the second bracket is provided with a tongue insert, the tongue insert being located on a side of the second bracket facing toward the first bracket; and
a fixing member, wherein the fixing member is connected to the circuit board and the fixing member is provided with a slot, the slot extending out from the escape hole and at least part of the tongue insert being inserted into the slot;
wherein the circuit board is a mainboard of the electronic device;
wherein the first bracket is provided with a sunken portion, the sunken portion facing toward the circuit board, the sunken portion being located between the escape hole and the second bracket, and the sunken portion abutting against a side of the tongue insert facing toward the circuit board.

11. The electronic device according to claim 10, wherein the fixing member comprises a base plate and a clip hook, the base plate being connected to the circuit board, the clip hook being disposed on a side of the base plate away from the circuit board, and the slot being formed between the clip hook and the base plate.

12. The electronic device according to claim 11, wherein the circuit board is provided with a mounting hole, a connecting pin is provided on a side of the base plate facing toward the circuit board, and the connecting pin is mounted inside the mounting hole, so as to mount the fixing member on the circuit board.

13. The electronic device according to claim 12, wherein the connecting pin is joined to the circuit board by welding.

14. The electronic device according to claim 12, wherein the mounting hole is a strip-shaped hole and a length direction of the mounting hole extends along a trace outgoing direction of a processor on the circuit board.

15. The electronic device according to claim 11, wherein the clip hook comprises a connecting plate and a fixing plate, the connecting plate being connected to the base plate, the connecting plate extending away from the circuit board, the fixing plate being connected to an end of the connecting plate away from the circuit board, and the fixing plate extending toward the tongue insert, so as to form the slot between the base plate, the connecting plate, and the fixing plate.

16. The electronic device according to claim 15, wherein the fixing plate extends away from the circuit board, so that an opening size of the slot is gradually reduced in a direction approaching the connecting plate.

17. The electronic device according to claim 10, wherein the second bracket is provided with a transition portion connecting to the tongue insert, the transition portion extending, in a direction facing the tongue insert, toward the circuit board.

18. The electronic device according to claim 10, wherein the first board-to-board connector is provided in plurality, and the plurality of first board-to-board connectors are arranged along a first direction; the second board-to-board connector is provided in plurality, and the plurality of second board-to-board connectors are arranged along a second direction; and an included angle between the first direction and the second direction is greater than 0°, wherein one of the first board-to-board connectors and one of the second board-to-board connectors are respectively located on two opposite sides of the fixing portion.

\* \* \* \* \*